United States Patent [19]

Uga

[11] Patent Number: 4,720,635
[45] Date of Patent: Jan. 19, 1988

[54] AUTOMATIC ACCURATE ALIGNMENT SYSTEM

[75] Inventor: Masanori Uga, Tokyo, Japan

[73] Assignee: Disco Abrasive Systems, Ltd., Tokyo, Japan

[21] Appl. No.: 808,124

[22] Filed: Dec. 12, 1985

[30] Foreign Application Priority Data

Dec. 17, 1984 [JP] Japan ............................ 59-264488

[51] Int. Cl.$^4$ ............................................. G01B 11/27
[52] U.S. Cl. .................................. 250/548; 356/400; 364/559
[58] Field of Search ................. 250/548, 557, 561; 356/399, 400, 401, 375; 364/559, 490, 491

[56] References Cited

U.S. PATENT DOCUMENTS 4,423,959 1/1984 Nakazawa et al. .............. 356/401
4,531,060 7/1985 Suwa et al. ..................... 250/548

Primary Examiner—Edward P. Westin
Attorney, Agent, or Firm—Beveridge, Degrandi & Weilacher

[57] ABSTRACT

An automatic accurate alignment system for positioning at a required position an object to be worked which has a certain pattern on its surface. The system includes a key pattern memory, a pattern matching device and movement control device. The key pattern memory memorizes a first signal indicative of a key pattern existing in a specified area and its position when the object to be worked is positioned at a predetermined position, and memorizes a second signal indicative of the key pattern existing in the specified area and its position when the object to be worked is rotated through 90 degrees from the predetermined the second signal is determined from the first signal. The pattern matching device performs a first pattern matching on the basis of the first signal and a second pattern matching on the basis of the second signal. The movement control device performs a first positioning of the object to be worked on the basis of the first pattern matching, then, rotates the object to be worked through 90 degrees, and thereafter, performs a second positioning of the object to be worked on the basis of the second pattern matching.

11 Claims, 9 Drawing Figures

AUTOMATIC ACCURATE ALIGNMENT SYSTEM

FIELD OF THE INVENTION

This invention relates to an automatic accurate alignment system for positioning at a required position an object to be worked which has a certain pattern on its surface, particularly a semiconductor wafer having a plurality of straight-line areas arranged in a lattice pattern on its surface and the same circuit pattern applied to each of a plurality of rectangular areas defined by these straight-line areas.

DESCRIPTION OF THE PRIOR ART

As is well known, in the production of semi-conductor devices, the surface of a nearly disc-like semiconductor wafer is defined into a plurality of rectangular areas by a plurality of straight-line areas (these straight-line areas are generally called streets) with predetermined widths which are arranged in a lattice pattern, and generally, the same circuit pattern is applied to each of these rectangular areas. Thereafter, the semiconductor wafer is cut at these straight-line areas on streets to separate the individual rectangular areas having the circuit pattern applied thereto. (These separated rectangular areas are generally called chips.) It is important that cutting of the semiconductor wafer should be carried out fully accurately at the aforesaid straight-line areas or streets. The width of each of the straight-line areas is very narrow, and is generally about several tens of $\mu$m. Hence, when such a semiconductor wafer is to be cut by a cutting means such as a diamond blade, it is necessary to align the semiconductor wafer extremely accurately with respect to the cutting means.

Automatic accurate alignment systems of various types have already been proposed and come into commercial acceptance to position a semiconductor wafer fully precisely at a required position for cutting purposes or otherwise. Such automatic accurate alignment systems are generally adapted to detect fully accurately the relative positions of the straight-line areas or streets existing on the surface of a semiconductor wafer held by a holding means and to move the holding means on the basis of the detected positions thereby setting the semiconductor wafer at the required position. A pattern matching method is generally utilized for detecting the relative positions of the straight-line areas or streets in such automatic accurate alignment systems. In its typical example, the pattern of a specified characteristic area, i.e. the first key pattern, on the surface of a semiconductor wafer located at a predetermined position and the position of the first key pattern, and the pattern of a specified characteristic area, i.e. the second key pattern, on the surface of the semiconductor wafer rotated through 90 degrees from the predetermined position and positioned at a predetermined position and the position of the second key pattern are memorized in advance. In the alignment, at first, the same pattern as the first key pattern is detected on the surface of the semiconductor wafer to be aligned and the alignment of the semiconductor wafer is performed on the basis of this detection. Furthermore, the semiconductor wafer is clockwise or counterclockwise rotated through 90 degrees, thereafter the same pattern as the second key pattern is detected on the surface of the semiconductor wafer and the alignment of the semiconductor wafer is performed on the basis of this detection.

The automatic accurate alignment systems as described above, however, have the defect or problem to be solved that it takes a considerably long period of time to memorize the key patterns and perform the pattern matching (i.e. detect the same patterns as the key patterns), and therefore, this becomes an obstacle to increasing the speed of such an operation as cutting in the step of processing the semiconductor wafer.

SUMMARY OF THE INVENTION

It is a primary object of this invention to provide an improved automatic accurate alignment system which can position at a required position an object to be worked such as a semiconductor wafer fully rapidly without reducing the alignment accuracy.

The following fact has now been found as a result of extensive investigations of the present inventor: In memorizing the key patterns, the selection and memorizing of the first key pattern before rotating the object to be worked through 90 degrees and the selection and memorizing of the second key pattern after rotating the object to be worked through 90 degrees have been separately and independently carried out so far. Furthermore, the pattern matching before rotating the object to be worked through 90 degrees (i.e. the detection of the same pattern as the first key pattern) and the pattern matching after rotating the object to be worked through 90 degrees (i.e. the detection of the same pattern as the second key pattern) have not been particularly related to each other and have been separately and independently performed so far. Therefore, it has taken a considerably long period of time to memorize the key patterns and perform the pattern matching. However, if the first key pattern before rotating the object to be worked through 90 degrees and the second key pattern after rotating the object to be worked through 90 degrees are made common to select one specified area, with respect to memorizing the key patterns, in memorizing the first key pattern it is necessary to actually detect the pattern and position of the specified area, but in memorizing the second key pattern the pattern and position of the specified area after rotating the object to be worked through 90 degrees can be calculated on the basis of data already memorized with respect to the first key pattern (so-called coordinate transformation calculation) to thus largely shorten the time required for memorizing the key patterns. Further, with respect to the pattern matching, if detecting the position of the same pattern as the first key pattern before rotating the object to be worked through 90 degrees, the position of the same pattern as the second key pattern after rotating the object to be worked through 90 degrees can be calculated on the basis of the former position of this same pattern (so-called coordinate transformation calculation) to thus largely shorten the time required for the pattern matching.

This invention is on the basis of the above-described fact found by the present invention. According to this invention, there is provided an automatic accurate alignment system for positioning at a required position an object to be worked which has a certain pattern on its surface, said system comprising holding means for holding the object to be worked, moving means for moving the holding means in the x-direction, the y-direction and the $\theta$-direction, camera means for taking at least a part of the image of the surface of the object held on the holding means and outputting analog signals showing the densities of x-y matrix arrayed pixels, an image frame memory for memorizing signals corresponding to the analog signals outputted by the camera means, a key pattern memory for memorizing a first key pattern signal showing a key pattern existing in at least one specified area in the image taken by the camera means on the basis of the signals memorized in the image frame memory and memorizing a first key pattern position signal showing the position of the key pattern when the object held on the holding means is positioned at a predetermined position, and further memorizing a second key pattern signal showing the key pattern and a second key pattern position signal showing the position of the key pattern when the object to be worked is rotated in the $\theta$-direction through 90 degrees from the predetermined position, on the basis of a calculation from the first key pattern signal and the first key pattern position signal, pattern matching means for performing a first pattern matching on the basis of the signals memorized in the image frame memory and the first key pattern signal memorized in the key pattern memory, and a second pattern matching on the basis of the signals memorized in the image frame memory and the second key pattern signal memorized in the key pattern memory, and movement control means for performing a first positioning of the object held on the holding means by actuating the moving means on the basis of the first pattern matching, then, rotating the holding means in the $\theta$-direction through 90 degrees and effecting a required coordinate transformation movement in the x-direction and the y-direction, and thereafter, performing a second positioning of the object held on the holding means by actuating the moving means on the basis of the second pattern matching.

DETAILED DESCRIPTION OF PREFERRED EMBODIMENTS

Now, referring to the accompanying drawings, one embodiment of the automatic accurate alignment system constructed in accordance with this invention will be described in detail.

Figure 1:
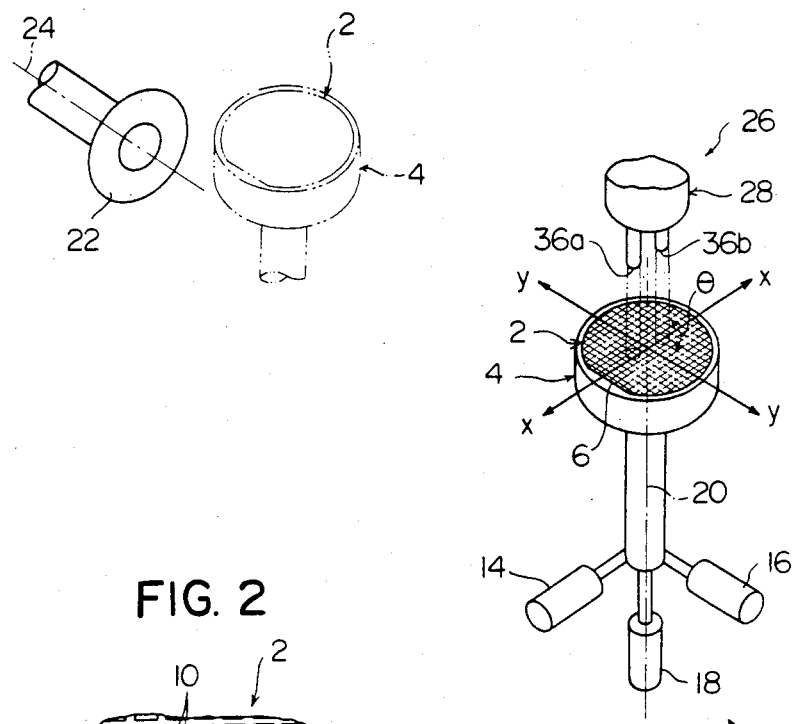
FIG. 1 is a simplified perspective view schematically showing a part of a semiconductor wafer cutting apparatus equipped with one embodiment of the automatic accurate alignment system constructed in accordance with this invention.
Figure 2:
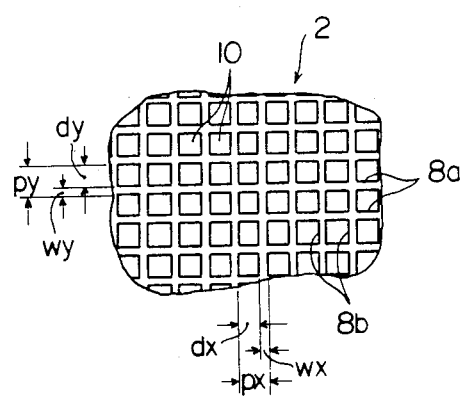
FIG. 2 is a partial top plan view showing a part of the surface of a typical semiconductor wafer.

FIG. 1 schematically shows a part of a semiconductor wafer cutting apparatus equipped with one embodiment of the automatic accurate alignment system constructed in accordance with this invention. A semiconductor wafer 2 to be cut is supplied by a suitable supply means (not shown) of a type known per se and placed on a holding means 4. At this time, the wafer 2 is placed on the holding means 4, not fully accurately but within a certain range of errors, for example, by utilizing an orientation flat 6 present in the wafer 2 (or, if the wafer 2 is mounted to a suitable frame with an adhesive tape, by utilizing a notch or the like for positioning formed on the frame). In more detail, as shown in FIG. 2, a plurality of straight-line areas 8a and 8b arranged in a lattice pattern exist on the surface of the wafer 2. These straight-line areas 8a and 8b are generally called streets. Streets 8a extending in the left and right direction in FIG. 2 are arranged at a predetermined distance dy from each other with a predetermined width wy, while streets 8b extending in the up-and-down direction in FIG. 2 are arranged at a predetermined distance dx from each other with a predetermined width wx. (The predetermined width wy is not always substantially equal to the predetermined width wx and it is not unusual they are different from each other. Similarly, the predetermined distance dy is not always substantially equal to the predetermined distance dx and it is not unusual they are different from each other.) Thus, on the surface of the wafer 2, a plurality of rectangular areas 10 arranged with a pitch of $px=wx+dx$ in the left and right direction in FIG. 2 and a pitch of $py=wy+dy$ in the up-and-down direction in FIG. 2 are defined by the straight-line areas or streets 8a and 8b. The same circuit pattern is applied to each of these rectangular areas 10. By utilizing the orientation flat 6, the wafer 2 is placed on the holding means 4 such that either the or streets 8a or the or streets 8b (the straight-line areas or streets 8a in the illustrated embodiment) are within an inclination angle range of, for example, about ±1.5 to ±3.0 degrees to a predetermined reference direction, i.e., the x-direction (FIG. 1).

Further, with reference to FIG. 1, the holding means 4 which may be of a known type surely holds the wafer 2 onto its surface by vacuum attraction, etc. The holding means 4 is mounted by a suitable supporting mechanism (not shown) so that it can move freely in the x-, y- and $\theta$-directions. A moving means 12 is drivingly connected to the holding means 4 to move it fully precisely in a required manner. In the illustrated embodiment, the moving means 12 is comprised of an x-direction moving source 14, a y-direction moving source 16 and a $\theta$-direction moving source 18. The x-direction moving source 14 conveniently constructed of a pulse motor, when actuated, moves the holding means 4 a predetermined distance in the x-direction with an accuracy of, for example, about 1 $\mu$m. The y-direction moving means 16 conveniently constructed of a pulse motor, when actuated, moves the holding means a predetermined distance in the y-direction, i.e. a direction perpendicular to the x-direction, with an accuracy of, for example, about 1 μm. The θ-direction moving source 18 which is likewise constructed conveniently of a pulse motor moves the holding means 4 by a given angle, namely rotates the holding means 4 about its central axis 20, with an accuracy of, for example, 0.0015° when it is actuated. If desired, instead of mounting the holding means 4 so that it can move freely in the x-direction and providing the holding means 4 with the x-direction moving source 14, it is possible to mount a microscope of an optical means 10 to be described so that it can move freely in the x-direction and to provide the microscope with an x-direction moving source.

A rotating blade 22 preferably formed of bonded diamond abrasive is provided in the illustrated semiconductor wafer cutting apparatus. The rotating blade 22 constituting wafer cutting means is mounted such that it can freely rotate about the central axis 24 which is substantially parallel to the y-direction, and can freely move in the x-direction. It is rotated at a predetermined speed by a suitable drive source (not shown) such as an AC motor, and is reciprocated in the x-direction at a predetermined speed by a suitable drive source (not shown) such as a DC motor.

In the illustrated semiconductor wafer cutting apparatus, the wafer 2 is placed on the holding means A by the supply means (not shown) while the holding means 4 exists in a supply and discharge zone which corresponds to the position shown by a solid line in FIG. 1 or its vicinity. Then, as will be stated in detail hereinafter, the position of the holding means 4 is finely adjusted so that the wafer 2 held on the holding means 4 is aligned fully accurately at a predetermined position with respect to the rotating blade 22. Then, the holding means 4 is advanced a predetermined distance in the y-direction to position the holding means 4 and the wafer 2 held on its upper surface at a cutting start zone adjacent to the rotating blade 22 as shown by two-dot chain lines in FIG. 1. Thereafter, while the rotating blade 22 is rotated, a cutting movement in the x-direction by which the wafer 2 is put in condition for undergoing the action of the blade 22 being rotated, and a so-called index movement by which the holding means 4 is moved in the y-direction by an amount corresponding to the pitch px (or py) of the rectangular areas 10 existing on the surface of the wafer 2 are alternately effected. As a result, the wafer 2 is cut along the straight-line areas or streets 8b (or 8a) existing on its surface. Subsequently, the holding means 4 is moved by an angle of 90 degrees (more specifically, an angle put in a little correction to 90 degrees as required) in the θ-direction about the central axis 20, and then the cutting movement and the index movement are performed alternately to cut the wafer 2 along the straight-line areas or streets 8a (or 8b) existing on its surface. The holding means 4 is then moved backward a predetermined distance in the y-direction and returned to the supply and discharge zone. The cut wafer 2 is discharged from the holding means 4 by a suitable discharge means (not shown) which may be of any type known per se, and the next wafer 2 is placed on the holding means 4 by the supply means (not shown). As is well known to those skilled in the art, the cutting of the wafer 2 by the rotating blade 22 is performed not over the entire thickness of the wafer 2 but in such a manner as to leave a small non-cut thickness, whereby the rectangular areas 10 (FIG. 2) can be prevented from being completely separated from each other (in which case subsequent application of some force breaks the remaining non-cut portion to separate the rectangular areas 10 completely and form chips). Alternatively, an adhesive tape may be applied in advance to the back surface of the wafer 2 so that even when the wafer 2 is cut over its entire thickness, the rectangular areas 10 will not be separated from each other (in which case subsequent peeling of the adhesive tape results in complete separation of the rectangular areas and formation of chips).

Figure 3:
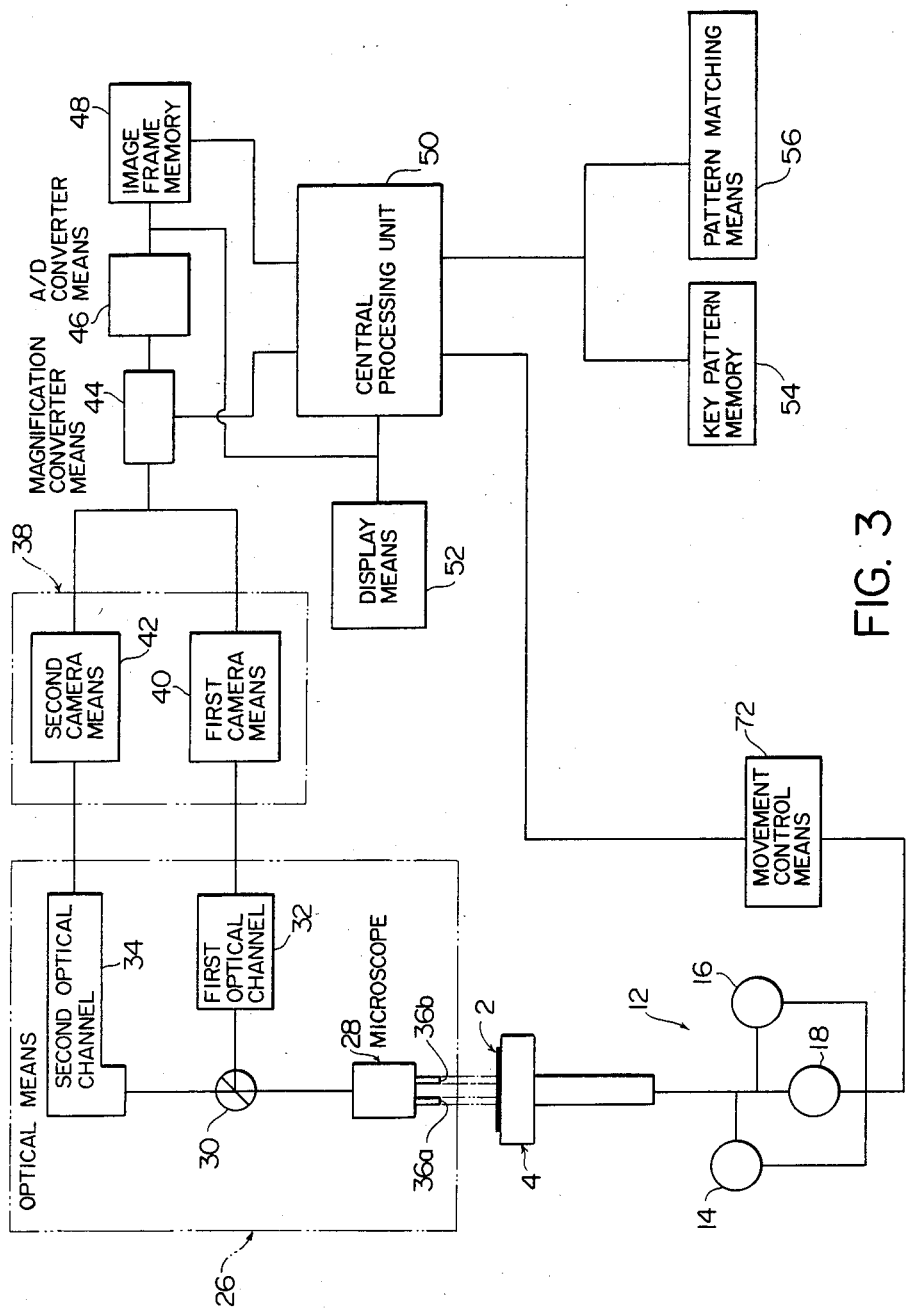
FIG. 3 is a block diagram showing one embodiment of the automatic accurate alignment system constructed in accordance with this invention.

With reference to FIG. 3 as well as FIG. 1, an optical means shown generally by a numeral 26 is provided in connection with the holding means 4 and the wafer 2 held on its surface when the holding means 4 exists in the supply and discharge zone. The illustrated optical means 26 includes a microscope 28, a light dividing means 30, a first optical channel 32 and a second optical channel 34. The microscope 28 of a relatively low magnification of, for example, 1.5 to 5 times is constructed of a binocular microscope having two light-incoming openings 36a and 36b spaced from each other a suitable distance of, for example, 40 mm to 55 mm in the x-direction. Hence, the images of two portions of the surface of the wafer 2 on the holding means 4 which are spaced from each other in the x-direction by a predetermined distance are inputted into the microscope 28 through the light-incoming openings 36a and 36b and sent out of the microscope 28 as split images. The light sent out of the microscope 28 is divided into two lights by means of the light dividing means 30 which can be constructed of a suitable means such as a half-mirror. One light, through the first optical channel 32, and the other light, through the second optical channel 34, are projected to a camera means 38. (The camera means 38 will be further described hereinafter). The first optical channel 32 projects the image sent out of the microscope 28 to the camera means 38 as it is without further magnifying it. Hence, the image of the surface of the wafer 2 projected to the camera means 38 through the first optical channel 32 is a magnified image of a relatively low magnification, for example, 1.5 to 5 times. If desired, the image of the surface of the water 2 projected to the camera means 38 through the first optical channel 32 can be an equal or somewhat reduced image. Therefore, the term, 'a relatively low magnification' ussed in this specification includes not only a low magnification but also an equal or a reduction to some extent. On the other hand, the second optical channel 34 includes magnifying lenses having a magnification of, for example, 5 to 10 times, further magnifies the image sent out of the microscope 28 and projects it to the camera means 38. Hence, the image of the surface of the wafer 2 projected to the camera means 38 through the second optical channel 34 is a magnified image of a relatively high magnification, for example, 7.5 to 30 times.

The camera means 38 in the illustrated embodiment includes a first camera means 40 optically connected to the first optical channel 32 and a second camera means 42 optically connected to the second optical channel 34. Each of the first and second camera means 40 and 42 may be of any type which can output an analog signal showing the density of x-y matrix arranged pixels according to the images projected. Preferably, it is constructed of a solid-state camera, particularly a solid camera having a plurality of image sensor elements such as CCDs, CPDs or MOSs arranged in an x-y matrix. In the illustrated embodiment, each of the first and second camera means 40 and 42 is constructed of a solid-state camera having 256×256 CCDs arranged in a matrix.

Only the image which has entered the left light-incoming opening 36a (or the right light-incoming opening 36b) of the microscope 28 is inputted into the 256×256 CCDs constituting the first camera means 40. The image which has entered the right light-incoming opening 36b (or the left light-incoming opening 36a) of the microscope 28 is not inputted into the first camera means 40. In other words, the first optical channel 32 projects only the image which has entered either of the two light-incoming openings of the microscope 28, i.e. the left light-incoming opening 36a (or the right light-incoming opening 36b) to the 256×256 CCDs constituting the first camera means 40 at the relatively low magnification. On the other hand, in the 256×256 CCDs constituting the second camera means 42, the image which has entered the left light-incoming opening 36a of the microscope 28 is inputted into the 128×256 CCDs located on their left half portion, and the image which has entered the right light-incoming opening 36b of the microscope 28 is inputted into the remaining 128×256 CCDs located on their right half portion. In other words, the second optical channel 34 projects the image which has entered the left light-incoming opening 36a of the microscope 28 to the 128×256 CCDs located on the left half portion of the 256×256 CCDs constituting the second camera means 42 at the relatively high magnificaiton and projects the image which has entered the right light-incoming opening 36b of the microscope 28 to the 128×256 CCDs located on the right half portion of the 256×256 CCDs constituting the second camera means 42 at the relatively high magnification. Each of the 256×256 CCDs produces an analog signal having a voltage corresponding to the gray level of a pixel inputted thereinto. Conveniently, an automatic gain adjusting means (not shown) known per se and capable of automatically adjusting the gain of an output analog signal according to the actual density of the image taken by the camera means is built in, or attached to, the solid-state camera having 256×256 CCDs.

With reference to FIG. 3, the first and second camera means 40 and 42 are connected to an A/D (analog/digital) converter means 46 through a magnification converter means 44, and the A/D converter means 46 is connected to an image frame memory 48. The magnification converter means 44 is controlled by a central processing unit (CPU) 50 which may be a microprocessor having a plurality of RAM built therein and electrically connects selectively either of the first and second camera means 40 and 42 to the A/D converter means 46. The A/D converter means 46 converts the input analog signals into multi-value digital signals which may, for example, be 8-bit digital signals (therefore, $2^8 = 256$ levels). The multi-value digital signals are fed to the image frame memory 48 and tentatively memorized there. The image frame memory 48 in the illustrated embodiment is comprised of RAM which has a storage capacity of at least 256×256×8 bits and therefore can memorize 256×256 eight-bit digital signals corresponding respectively to the densities of 256×256 pixels inputted into the 256×256 CCDs in the solid-state camera constituting each of the first and second camera means 40 and 42. Thus, the multi-value digital signals corresponding respectively to the image projected to the first camera means 40 at the relatively low magnification and the image projected to the second camera means 42 at the relatively high magnification of the surface of the wafer 2 held on the holding means 4 are selectively memorized in the image frame memory 48. If desired, the optical means 26 can be constructed of a microscope which can vary its magnification between a relatively low magnification and a relatively high magnification (in this case, the camera means 38 can be only one and the magnification converter means 44 can be omitted) and the multi-value digital signals corresponding respectively to the image at the relatively low magnification and the image at the relatively high magnification of the surface of the wafer 2 held on the holding menas 4 can be selectively memorized in the image frame memory 48 by selectively varying the magnification of the microscope constituting the optical means 26.

In the illustrated embodiment, a display means 52 is also provided which is constructed conveniently of a cathode ray tube (CRT). The display means 52 visually displays selectively an image corresponding to the multi-value digital signal outputted by the A/D converter means 46, the signal stored in RAM built in the central processing unit 50 or the signal stored in the key pattern memory to be described, according to the manual operation of a switching means (not shown). The illustrated display means 52 displays on its entire screen the image which has entered the left light-incoming opening 36a (or the right light-incoming opening 36b) of the microscope 28 in a total magnification of, for example, about 50 times when displaying the image projected to the first camera means 40, while the display means 52 displays at the left half portion of its screen the image which has entered the left light-incoming opening 36a of the microscope 28 and at the right half portion of its screen the image which has entered the right light-incoming opening 36b of the microscope 28, each in a total magnification of, for example, about 260 times when displaying the image projected to the second camera means 42.

A key pattern memory 54 and a pattern matching means 56 are further connected to the central processing unit 50.

The key pattern memory 54 which may be constructed of RAM or the like memorizes a first key pattern signal showing the pattern of at least one specified area, i.e. the key pattern, in the image of the surface of the wafer 2 projected to the second camera means 42 at the relatively high magnification, and a first key pattern position signal showing the position of this key pattern when the wafer 2 held on the holding means 4 is located at a predetermined position. The key pattern memory 54 also memorizes a second key pattern signal showing the aforesaid key pattern and a second key pattern position signal showing the position of the aforesaid key pattern when the wafer 2 held on the holding means 4 is rotated through 90 degrees from the predetermined position. As will be described in more detail hereinafter, it is important to memorize these second key pattern signal and second key pattern position signal by calculating from the first key pattern signal and first key pattern position signal. Furthermore, the key pattern memory 54 memorizes a low magnification key pattern signal showing the pattern of at least one specified area, i.e. the low magnification key pattern, in the image of the surface of the wafer 2 projected to the first camera means 40 at the relatively low magnification and a low magnification key pattern position signal showing the position of this low magnification key pattern when the wafer 2 held on the holding means 4 is located at the aforesaid predetermined position.

Figure 4:
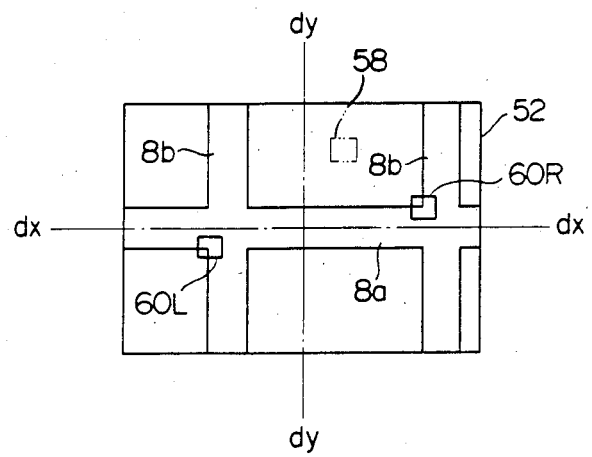
FIG. 4 is a simplified view illustrating the designated positions of specified areas in the image of a sample wafer at a relatively high magnification on a display panel of display means.

The first key pattern signal and the first key pattern position signal are memorized as follows: At first, the sample wafer 2 is placed on the holding means 4, and then the holding means 4 is moved by properly actuating the x-direction moving source 14, the y-direction moving source 16 and the θ-direction moving source 18 by hand, thereby positioning the sample wafer 2 on the holding means 4 at a required position with respect to the optical means 26. In performing this manual positioning, the second camera means 42 is connected to the A/D converter means 46 by controlling the magnification converter means 44, and the multi-value digital signals outputted by the A/D converter means 46 are visually displayed by the display means 52. Therefore, the magnified image of the surface of the sample wafer 2 at the relatively high magnification is visually displayed by the display means 52. An operator observes the image displayed on the display means 52 and thus positions the sample wafer 2 so that as schematically shown in FIG. 4, the center line of the straight-line area or street 8a in the surface of the sample wafer 2 substantially corresponds with the transverse center line of the displayed image on the display means 52, i.e. the dx-dx image. Then, in each of the left half portion and the right half portion of the displayed image on the display means 52, cursors 58 are manually positioned respectively at specified areas 60L and 60R. The cursors 58, and therefore the specified areas 60L and 60R designated by the cursors 58, may, for example, be in the form of a square having a size corresponding to 32×32 pixels (corresponding to 32×32 CCDs in the second camera means 42). The specified areas 60L and 60R designated by the cursors 58 are preferably areas having a marked characteristic, for example areas located at the crossing of the straight-line area or street 8a and the straight-line area or street 8b. The specified area 60L and the specified area 60R may have different patterns from each other or may have the same pattern. Then, those multi-value digital signals stored in the image frame memory 48 which correspond to 32×32=1024 pixels existing in the specified areas 60L and 60R are fed to, and stored in, the key pattern memory 54. Simultaneously, signals showing the positions of the specified areas 60L and 60R, more specifically, the positions $(Lx_1, Ly_1)$ and $(Rx_1, Ry_1)$ in a x-y coordinate system with the origin (O,O) of the center of rotation of the holding means 4 are also fed to, and stored in, the key pattern memory 54. For the positions $(Lx_1, Ly_1)$ and $(Rx_1, Ry_1)$ of the specified areas 60L and 60R, for example, the positions of the central points in the x-direction and the y-direction of the specified areas 60L and 60R may be selected. Thus, the key pattern memory 54 memorizes a first left key pattern signal and a first left key pattern position signal with respect to the specified area 60L, and a first right key pattern signal and a first right key pattern position signal with respect to the specified area 60R.

Figure 5:
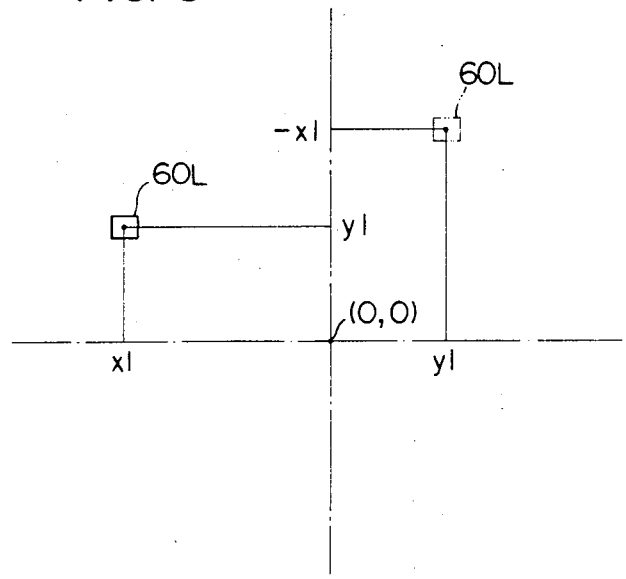
FIG. 5 is a simplified diagram for explaining the relationship of the specified area before and after rotating the sample wafer through 90 degrees.

In the next place, a method of memorizing the aforesaid second key pattern signal and second key pattern position signal is described. Heretofore, in order to memorize the second key pattern signal and the second key pattern position signal, the sample wafer 2 held on the holding means 4 has been actually rotated clockwise (or counterclockwise) through 90 degrees to position it at a required position by hand, thereafter, different specified areas from the specified areas 60L and 60R have been selected, and a similar memorizing method to the memorizing method for the first left key pattern signal and first left key pattern position signal and the first right key pattern signal and first right key pattern position signal has been carried out so far with respect to these specified areas. In the present invention, however, the aforesaid specified areas 60L and 60R are again selected for the specified areas after the sample wafer 2 held on the holding means 4 is rotated clockwise (or counterclockwise) through 90 degrees. A second left key pattern signal showing the pattern of the specified area 60L and a second left key pattern position signal showing the position of the specified area 60L, and a second right key pattern signal showing the pattern of the specified area 60R and a second right key pattern position signal showing the position of the specified area 60R after the sample wafer 2 held on the holding means 4 is rotated clockwise (or counterclockwise) through 90 degrees are immediately memorized by carrying out a so-called coordinate transformation calculation on the basis of the first left key pattern signal and first left key pattern position signal and the first right key pattern signal and first right key pattern position signal memorized previously, without actually rotating clockwise (or counterclockwise) the sample wafer 2 held on the holding means 4 through 90 degrees. This coordinate transformation calculation is described with reference to FIG. 5. For example, when the position of any pixel in the specified area 60L in the x-y coordinate system with the origin (O,O) of the center of rotation of the holding means 4, is $(x_1, y_1)$ the position of the same pixel in the same x-y coordinate system becomes $(y_1, -x_1)$ by coordinate transformation when the holding means 4 and the sample wafer 2 held thereon is rotated clockwise through 90 degrees. Naturally, the density itself of the aforesaid pixel does not change. Therefore, by only carrying out the coordinate transformation calculation, the second left key pattern signal and second left key pattern position signal and the second right key pattern signal and second right key pattern position signal can be memorized without necessity of rotating actually the sample wafer 2 held on the holding means 4 clockwise (or counterclockwise) through 90 degrees and detecting actually the patterns of the specified areas 60R and 60L. It will be easily understood that the time required for memorizing the signals with respect to the key patterns can be thus largely shortened.

Figure 6:
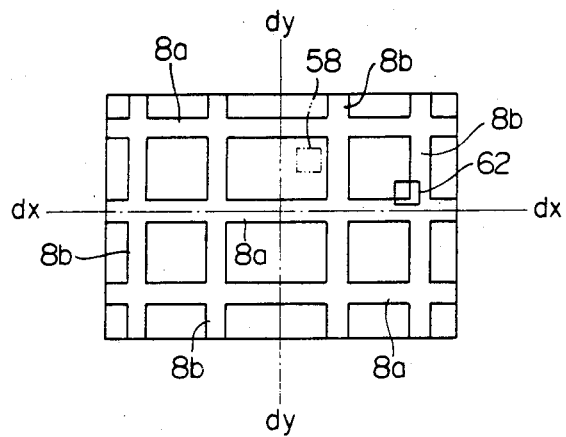
FIG. 6 is a simplified view illustrating the designated position of a specified area in the image of the sample wafer at a relatively low magnification on the display panel of the display means.

The aforesaid low magnification key pattern signal and low magnification key pattern position signal are memorized as follows: The first camera means 40 is connected to the A/D converter means 46 by controlling the magnification converter means 44 and thus the image of the surface of the sample wafer 2 at the relatively low magnification is visually displayed on the display means 52 as schematically shown in FIG. 6. The cursor 58 is manually positioned at a specified area 62 in the displayed image on the display means 52. This specified area 62 may be one with the same center as the specified area 60L or 60R (FIG. 4) (therefore, a reduced image of the specified area 60L or 60R) or one with a different center. Then, those multi-value digital signals stored in the image frame memory 48 which correspond to 32×32=1024 pixels existing in the specified area 62 (these pixels correspond to 32×32=1024 CCDs in the first camera means 40) are fed to, and stored in, the key pattern memory 54. Simultaneously, a signal showing the position of the specified area 62, more specifically, the position (x', y') in the x-y coordinate system with the origin (O,O) of the center of rotation of the holding means 4 is also memorized. Thus, the low magnification key pattern signal and low magnification key pattern position signal with respect to the specified area 62 are memorized in the key pattern memory 54.

Figure 7:
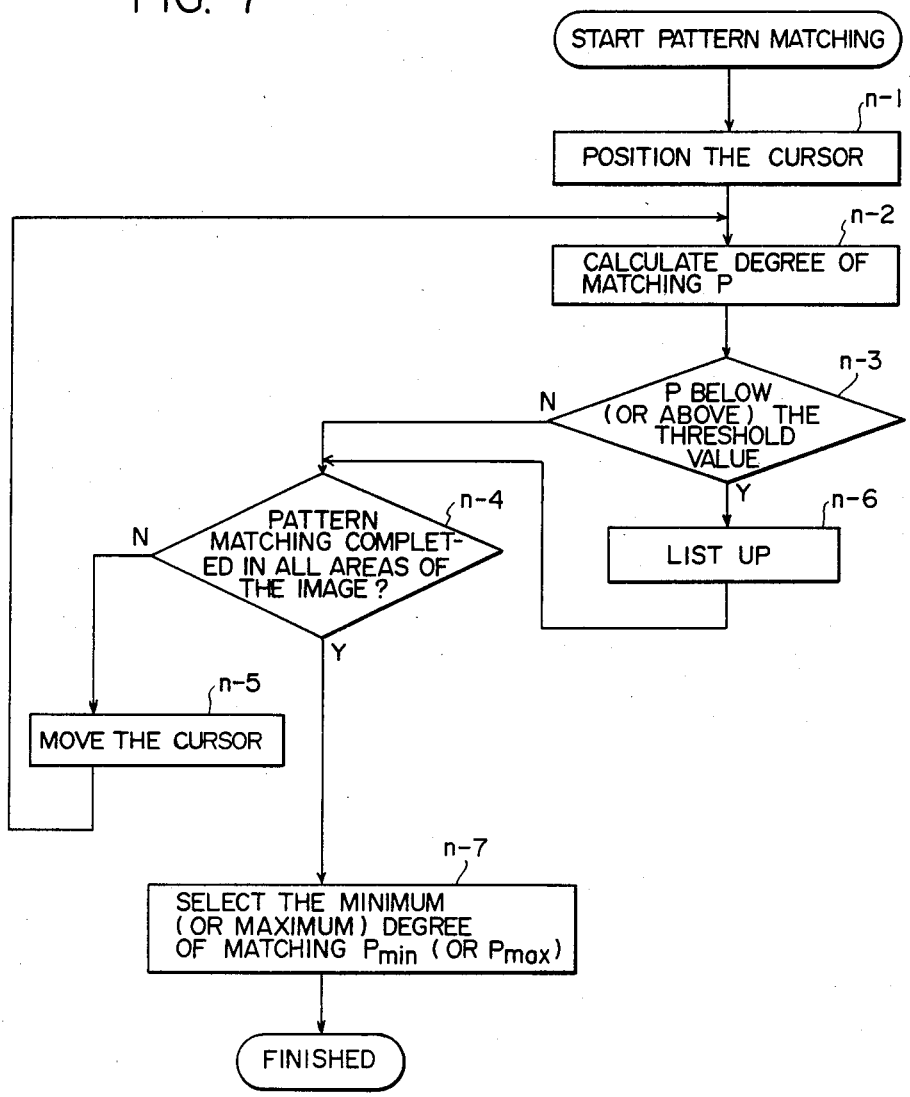
FIG. 7 is a flow chart showing one example of the pattern matching procedure by pattern matching means.

The pattern matching means 56 detects the same pattern as the low magnification key pattern (low magnification pattern matching) in the image, projected to the first camera means 40 at the relatively low magnification, and detects the same patterns as the first left and right key patterns (first pattern matching) and the same patterns as the second left and right key patterns (second pattern matching) in the image, projected to the second camera means 42 at the relatively high magnification, on the surface of the wafer 2 held on the holding means 4 and adapted to be automatically positioned at a required position, and thus detects the relative positions of the straight-line areas or streets 8a and 8b. One example of the detection by the pattern matching means 56 will be described below. With reference to the flow chart shown in FIG. 7, a description will be made of the case of detecting the same pattern as the pattern of the specified area 62, i.e. the low magnification key pattern in the image inputted from the left light-incoming opening 36a (or the right light-incoming opening 36b) of the microscope 28 in the optical means 26 and projected to the first camera means 40 through the first optical channel 32 at the relatively low magnification, i.e. in the image displayed on the entire screen of the display means 52 at the relatively low magnification. First, in step n-1, the cursor 58 is positioned at a specified site, for example the left top corner of the displayed image on the display means 52; thereby defining a collation area to be colllated with the key pattern. Then, step n-2 sets in, and the degree of matching, P, between the collation area and the low magnification key pattern is calculated. The degree of matching, P, can be calculated on the basis of the multi-value digital signals showing the low magnification key pattern, i.e. 32×32 multi-value digital signals showing the densities of 32×32 pixels in the specified area 62, which are stored in the key pattern memory 54, and 32×32 multi-value digital signals showing the densities of 32×32 pixels in the collation area which are among those multi-value signals which have been inputted into the image frame memory 48 from the first camera means 40 via the A/D converter means 46. The degree of matching, P, itself can be calculated, for example, in accordance with the following equation A.

$$P = \sum_{i,j} |[f(i,j) - \bar{f}] - [g(i,j) - \bar{g}]| \quad A$$

wherein f is a value corresponding to the density of each of 32×32 pixels in the collation area, f̄ is an average of f values, g is a value corresponding to the density of each of 32×32 pixels in the low magnification key pattern, ḡ is an average of g values, (i,j) show the row and column of each pixel, and therefore i=1–32, j=1–32. In this case, the smaller (i.e. the nearer to zero) the value of P is, the higher the degree of matching is. In the calculation of the degree of matching, P, in accordance with the equation A, the differences between the deviated values of the densities of the individual pixels in the collation area (i.e., the values obtained respectively by subtracting the average density value from the actual density values) and the deviated values of the densities of the individual pixels of the low magnification key pattern are added up. Accordingly, variations in a so-called density gain ascribable, for example, to variations in illuminance in the collation area are excluded, and a fully reliable degree of matching, P, can be obtained.

For simplification of the mathematical operation, the degree of matching, P, can also be calculated on the basis of the following equation $$P = \sum_{i,j} |U[f(i,j) - \bar{f}] - U[g(i,j) - \bar{g}]| \quad B$$

wherein U means binarization, and U(x)=1 when x>0, and U(x)=0 when x≦0, which results from binarization of [f(i,j)−f̄] and [g(i,j)−ḡ] in the aove equation A. In this case, the smaller (i.e. the nearer to zero) the value of P is, the higher the degree of matching is, too.

To increase the reliability of the matching degree P further, the degree of matching, P, can also be obtained in accordance with the following equaiton $$P = \frac{\sum_{i,j} [f(i,j) - \bar{f}] \times [g(i,j) - \bar{g}]}{\sqrt{\sum_{i,j} [f(i,j) - \bar{f}]^2 \times \sum_{i,j} [g(i,j) - \bar{g}]^2}} \quad C$$

wherein f, f̄, g, ḡ and (i,j) are the same as defined for equation A,
on the basis of so-called normalizing correlation. In this case, the bigger (i.e. the nearer to one) the value of P is, the higher the degree of matching is.

In calculating the degree of matching, P, on the basis of equaiton A, B or C above, the correlation treatment may be carried out only on a plurality of specified pixels in the collation area, for example, only 32 specified pixels selected on the basis of one from each row and one from each column, instead of performing it on all of the pixels (32×32=1024) in the collation area, in order to increase the operating speed. In particular, it has been ascertained that when the degree of matching, P, is to be calculated on the basis of equation C, sufficient and good results can be obtained with regard to most semiconductor wafers even when the correlation treatment is carried out only on a plurality of specified pixels in the collation area.

After the calculation of the degree of matching, P, it is judged in step n-3 whether the calculated degree of matching, P, is below (or above) a predetermined threshold value. The predetermined threshold value may be properly set by the operator (for example, on a trial-and-error basis), and stored in the key pattern memory 54 or the RAM in the central processing unit 50. When the calculated degree of matching, P, is not below (or above) the predetermined threshold value (i.e., when the degree of matching is relatively low), step n-4 sets in, and it is determined whether the cursor 58 has been moved over the entire area of an image projected from the left light-incoming opening 36a (or the right light-incoming opening 36b) of the microscope 28 to the first camera means 40 through the first optical channel 32 at the relatively low magnification, namely an image displayed on the entire display panel of the display means 52 at the relatively low magnification. When the movement of the cursor 58 over the entire area of the aforesaid image has not yet been completed, step n-5 sets in, and the cursor 58 is moved by one pixel in the x-direction and/or y-direction to the next collation area. Thereafter, the degree of matching, P, is calculated in step n-2, and it is judged in step n-3 whether the calculated degree of matching, P, is below (or above) the predetermined threshold value. When the calculated degree of matching, P, is below (or above) the predetermined threshold value (i.e., when the degree of matching is relatively high), step n-3 is followed by step n-6 in which the position of the collation area and the degree of matching, P, are memorized in RAM built in the pattern matching means 56 or RAM built in the central processing unit 50 and listed up. Then, step n-4 sets in. When the degree of matching, P, has been calculated, and it has been judged whether the calculated degree of matching, P, is below (or above) the predetermined threshold value, over the entire area of the image projected from the left light-incoming opening 36a of the microscope 28 to the first camera means 40 through the first optical channel 32 at the relatively low magnification, namely the image displayed on the entire display panel of the display means 52 at the relatively low magnification, step n-4 is followed by step n-7 in which the smallest (or largest) of the degrees of matching. P, listed up in step n-6 is selected, and it is determined that a collation area which has the smallest (or largest) degree of matching, $P_{min}$ (or $P_{max}$), is the same as the low magnification key pattern, i.e., the specified area 62. Pattern detection in other cases can also be subject to substantially the same procedure as described above with reference to the flow chart shown in FIG. 7. In the pattern detection in the image at the relatively high magnification, however, pattern detection is carried out separately in each of an image projected from the left light-incoming opening 36a of the microscope 28 to the left half portion of the second camera means 42 and an image projected from the right light-incoming opening 36b of the microscope 28 to the right half portion of the second camera means 42.

The automatic accurate alignment system constructed in accordance with this invention also includes a movement control means 72 adapted to control the operation of the moving means 12, more specifically the x-direction moving source 14, the y-direction moving source 16 and the θ-direction moving source 18, and to position the wafer 2 held on the holding means 4 at a required position. The movement control means 72 actuates the moving means 12 on the basis of the low magnification pattern matching by the pattern matching means 56 with respect to the image at the relatively low magnification to thus perform a preliminary positioning of the wafer 2, and thereafter actuates the moving means 12 on the basis of the first pattern matching by the pattern matching means 56 with respect to the image at the relatively high magnification to thus perform a first positioning of the wafer 2, and furthermore actuates the moving means 12 on the basis of the second pattern matching by the pattern matching means 56 with respect to the image at the relatively high magnification to thus perform a second positioning of the wafer 2.

Figure 9:
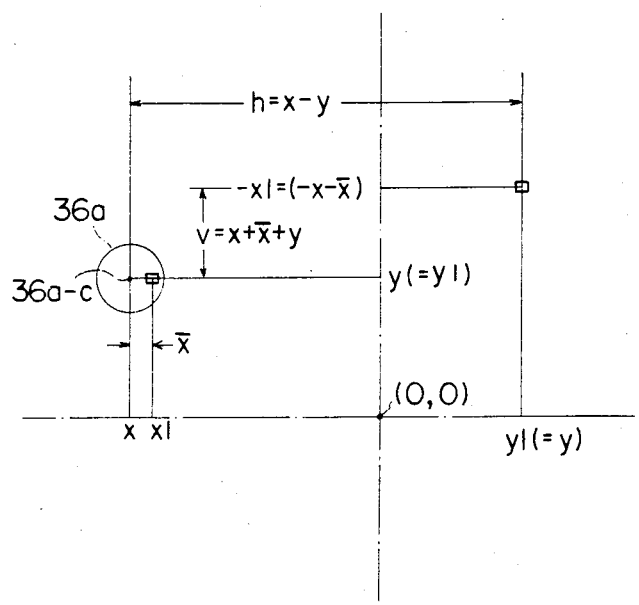
FIG. 9 is a simplified diagram for explaining the relationship between a light-incoming opening of a microscope and a specified area before and after rotating a wafer through 90 degrees.
Figure 8:
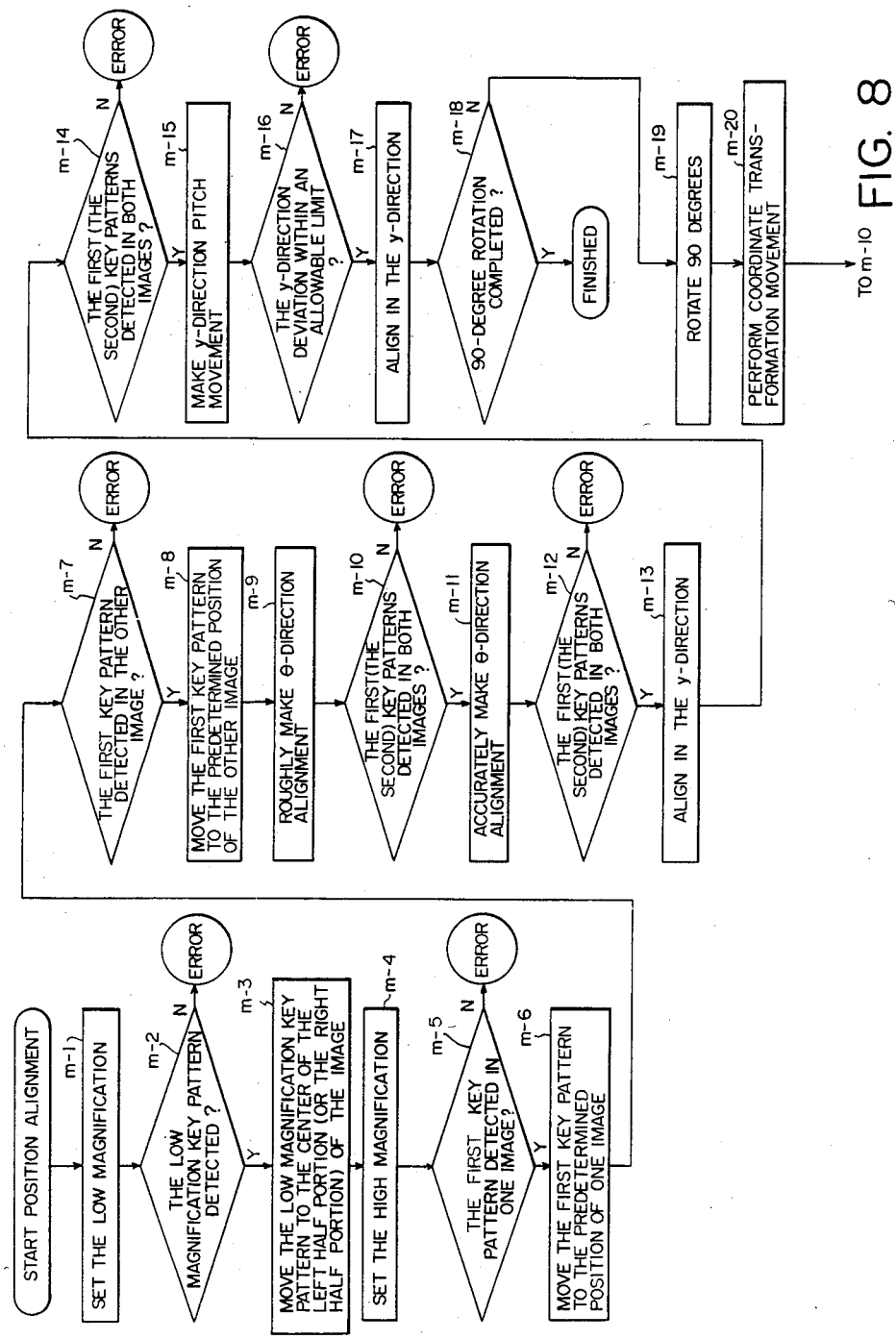
FIG. 8 is a flow chart showing one example of the alignment procedure.

FIG. 8 shows one example of a flow chart showing position alignment by the movement control means 72. With reference to FIG. 8, in step m-1, the magnification converter means 44 connects the first camera means 40 to the A/D converter means 46 and therefore the display means 52 is set up to visually display the image of the surface of the wafer 2 at the relatively low magnification. Then, it is judged in step m-2 whether the pattern matching means 56 detects the same pattern as the low magnification key pattern, i.e. the pattern of the specified area 62 (FIG. 6), in the image projected to the first camera means 40 at the relatively low magnification, i.e. the image projected from the left light-incoming opening 36a (or the right light-incoming opening 36b) of the microscope 28 to the first camera means 40 through the first optical channel 32 at the relatively low magnification. In the illustrated embodiment, the specified area 62 (FIG. 6) necessarily exists in the image at the relatively low magnification in a normal state because of the placing operation within a required error limit of the wafer 2 onto the holding means 4 utilizing the orientation flat 6 in the wafer 2 (and, if necessary, an adjustment movement of the holding means 4 by actuating the moving means 12 carried out subsequently), and therefore the pattern matching means 56 necessarily detects the same pattern as the low magnification key pattern. Subsequently, in step m-3, the x-direction moving source 14 and the y-direction moving source 16 of the moving means 12 are actuated to move the holding means 4 and the wafer 2 held thereon such that the center of the same pattern as the low magnification key pattern detected in step m-2 is located at a specified position of the left half portion (or the right half portion) of the displayed image on the display means 52, for example, the center in both of the transverse center line (the dx-dx line) direction and the longitudinal center line (the dy-dy line) direction. Thus, the specified area 60L (FIG. 4), in other words, the same pattern as the first left key pattern is caused to surely exist in one of the two images projected to the second camera means 42 at the relatively high magnification, i.e. the image projected from the left light-incoming opening 36a of the microscope 28 to the second camera means 42 through the second optical channel 34 at the relatively high magnification. Thus, the preliminary positioning is over and the first positioning is to be carried out. Specifically, in step m-4, the magnification converter means 44 connects the second camera means 42 to the A/D converter means 46 and therefore the display means 52 is set up to visually display the image of the surface of the wafer 2 at the relatively high magnification. Then, it is judged in step m-5 whether the pattern matching means 56 detects the same pattern as the first left key pattern, i.e. the pattern of the specified area 60L (FIG. 4), in one of the two images projected to the second camera means 42 at the relatively high magnification, i.e. the image projected from the left light-incoming opening 36a of the microscope 28 to the second camera means 42 through the second optical channel 34 at the relatively high magnification. In this first pattern matching, the pattern matching means 56 can detect the same pattern as the first left key pattern sufficiently rapidly since step m-3 has already been carried out. Then, in step m-6, the x-direction moving source 14 and the y-direction moving source 16 of the moving means 12 are actuated to move the holding means 4 and the wafer 2 held thereon such that the center of the same pattern as the first left key pattern detected in step m-5 is located at a specific position in the left half portion of the displayed image on the display means 52, for example, the center in both of the transverse center line (the dx-dx line) direction and the longitudinal center line (the dy-dy line) direction. Subsequently, step m-7 sets in and it is judged whether the pattern matching means 56 detects the same pattern as the first right key pattern, i.e. the pattern of the specified area 60R (FIG. 4), in the other of the two images projected to the second camera means 42 at the relatively high magnification, i.e. the image projected from the right light-incoming opening 36b of the microscope 28 to the second camera means 42 through the second optical channel 34 at the relatively high magnification. When the pattern matching means 56 detects the same pattern as the first right key pattern, step m-8 sets in. In step m-8, the x-direction moving source 14 and the y-direction moving source 16 of the moving means 12 are actuated to move the holding means 4 and the wafer 2 held thereon such that the center of the same pattern as the first right key pattern detected in step m-7 is located at a specific position in the right half portion of the displayed image on the display means 52, for example, the center in both of the transverse center line (the dx-dx line) direction and the longitudinal center line (the dy-dy line) direction. Then, step m-9 sets in. In step m-9, the pattern matching means 56 detects the same patterns as the first left and right key patterns respectively, i.e. the patterns of the specified areas 60L and 60R (FIG. 4), in both of the two images projected to the second camera means 42 at the relatively high magnification, and the inclination angle of the straight-line area or street 8a to the transverse center line (the dx-dx line) in the displayed image on the display means 52 is calculated on the basis of the y-direction (i.e. the dy-dy line direction) positions of the same patterns as the first left and right key patterns in the both images, and according to this, the θ-direction moving source 18 of the moving means 12 is actuated to correct the above inclination (θ-direction rough alignment). Thereafter, step m-10 sets in and it is ascertained whether the pattern matching means 56 detects the same patterns as the first left and right key patterns, i.e. the patterns of the specified areas 60L and 60R (FIG. 4), in the both of the two images projected to the second camera means 42 at the relatively high magnification. Then, in step m-11, the inclination angle of the straight-line area or street 8a to the transverse center line (the dx-dx line) in the displayed image on the display means 52 is calculated on the basis of the y-direction (i.e. the dy-dy line direction) positions of the same patterns as the first left and right key patterns in the both images, and according to this, the θ-direction moving source 18 of the moving means 12 is actuated to correct the above inclination (θ-direction accurate alignment). Thereafter, step m-12 sets in and it is ascertained as in step m-10 whether the pattern matching means 56 detects the same patterns as the first left and right key patterns respectively in both of the two images projected to the second camera means 42 at the relatively high magnification. Then, in step m-13, the y-direction (i.e. the dy-dy line direction) deviation of the straight-line area 8a from the transverse center line (the dx-dx line) in the displayed image on the display means 52 is calculated on the basis of the y-direction positions of the same patterns as the first left and right key patterns, and according to this, the y-direction moving source 16 of the moving means 12 is actuated to correct the above deviation, i.e. to cause the center of the straight-line area 8a to coincide with the transverse center line (the dx-dx line) in the displayed image on the display means 52 (y-direction alignment). Thereafter, step m-14 sets in and it is ascertained whether the pattern matching means 56 detects the same patterns as the first left and right key patterns respectively in both of the two images projected to the camera means 42 at the relatively high magnification. Then, step m-15 sets in and the y-direction moving source 16 of the moving means 12 is actuated to move the holding means 4 and the wafer 2 held thereon by the pitch py (FIG. 2) of the straight-line areas or street 8a. (The pitch py may be memorized in RAM built in the central processing unit 50 beforehand.) Then, step m-16 sets in and it is ascertained whether the y-direction (i.e. the dy-dy line direction) deviation of the straight-line area or street 8a from the transverse center line (the dx-dx line) in the displayed image on the display means 52 is within an allowable limit, on the basis of the y-direction positions of the same patterns as the first left and right key patterns detected by the pattern matching means 56 in both (or either) of the two images projected to the second camera means 42 at the relatively high magnification. Thereafter, step m-17 sets in and the deviation detected in step m-16 is corrected, i.e. the y-direction moving source 16 of the moving means 12 is actuated to cause the center of the straight-line area or street 8a to coincide with the transverse center line (the dx-dx line) in the displayed image on the display means 52 (y-direction alignment). The first positioning is finished in this way and the second positioning is started. Specifically, one goes to step m-18, and it is judged whether the holding means 4 and the wafer 2 thereon have been rotated through 90 degrees (in other words, whether the second positioning has been started). When the 90-degree rotation has not yet been carried out, step m-19 sets in and the θ-direction moving source 18 of the moving means 12 is actuated to rotate clockwise (or counterclockwise) the holding means 4 and the wafer 2 thereon through 90 degrees. Then, step m-20 sets in, and in this step m-20 the x-direction moving source 14 and the y-direction moving source 16 of the moving means 12 are actuated to move the holding means 4 and the wafer 2 thereon by an x-direction predetermined amount and a y-direction predetermined amount (coordinate transformation movement). Thus, it is ensured that the same patterns as the second left and right key patterns, i.e. the patterns of the specified areas 60L and 60R exist at required positions respectively in the two images projected to the second camera means 42 at the relatively high magnification after the 90-degree rotation has been carried out in step m-19. The x-direction predetermined amount and the y-direction predetermined amount are calculated on the basis of the positions of the centers of the light-incoming openings 36a and 36b of the optical means 26 and the positions (of the centers) of the specified areas 60L and 60R in the x-y coordinate system with the origin of the center of rotation of the holding means 4 in the state after the y-direction alignment has been carried out in step m-17. This is described in more detail with reference to FIG. 9. The position of the center 36a-c of the light-incoming opening 36a of the optical means 26 is made (x,y) and the position of the specified area 60L is made $(x_1, y_1)$ in the x-y coordinate system with the origin of the center of rotation of the holding means 4 in the state after the y-direction alignment has been carried out in step m-17. Then, $y=y_1$ since the above-described y-direction alignment has been carried out in step m-17. On the other hand, let $x_1-x$ i.e. equal $\bar{x}$ ($x_1-x=\bar{x}$). When the holding means 4 and the wafer 2 held thereon are rotated clockwise in step m-19, the position of the specified area 60L becomes $(y_1, -x_1)$, i.e. $(y, -x-\bar{x})$. Therefore, if the holding means 4 and the wafer 2 held thereon are moved in the x-direction by a predetermined amount of $h=x-y$ and moved in the y-direction by a predetermined amount of $v=x+\bar{x}+y$, the specified area 60L is positioned at the center 36a-c of the light-incoming opening 36a, i.e. the center in both of the transverse center line (the dx-dx line) direction and the longitudinal center line (the dy-dy line) direction in the left half portion of the displayed image on the display means 52. Although the amount of h=x−y can be employed as the aforesaid x-direction predetermined amount, since the straight-line areas or streets 8a exist at the pitches py as shown in FIG. 2 and therefore the specified areas 60L exist at the pitches py in the x-direction after the 90-degree rotation, the same area as the specified area 60L is positioned in conformation with the center 36a-c of the light-incoming opening 36a in the x-direction even if the wafer 2 is moved in the x-direction by the remainder αx when dividing h=x−y by py. Then, preferably, the remainder αx is employed as the x-direction predetermined amount to thus reduce the required moving amount in the x-direction and reduce the time required for the x-direction movement. Similarly, although the amount of v=x+x̄+y can be employed as the aforesaid y-direction predetermined amount, since the straight-line areas 8b exist at the pitches px as shown in FIG. 2 and therefore the specified areas 60L exist at the pitches px in the y-direction after the 90-degree rotation, the same area as the specified area 60L is positioned in conformation with the center 36a-c of the light-incoming opening 36a in the y-direction even if the wafer 2 is moved in the y-direction by the remainder αy when dividing v=x+x̄+y by px. Then, preferably, the remainder αy is employed as the y-direction predetermined amount to thus reduce the required moving amount in the y-direction and reduce the time required for the y-direction movement. Thereafter, one goes back to step m-10. After returning to step m-19 and m-20, it is judged in steps m-10, m-11, m-12, m-13, m-16 and m-20 whether the pattern matching means 56 detects the same patterns as the patterns of the second key patterns (i.e. the patterns of the specified areas 60L and 60R after the 90-degree rotation) instead of the first key patterns (i.e. the patterns of the specified areas 60L and 60R before the 90-degree rotation) in both (or either) of the two images projected to the second camera means 42 at the relatively high magnification. In steps m-11, m-13 and m-17, the inclination or the y-direction deviation of the straight-line area or street 8b instead of the straight line area or street 8a to or from the transverse center line (the dx-dx line) in the displayed image on the display means 52 is corrected, and in step m-15, the holding means 4 and the wafer 2 held thereon are moved by the pitch px of the straight-line areas 8b instead of the pitch py of the straight-line areas 8a. The second positioning is effected as described above, and consequently, the wafer 2 is positioned at a required position fully rapidly and fully accurately. Further, the rotation angle to correct the inclination in step m-11 (this rotation angle to correct the inclination results from, for example, an error in the 90-degree rotation of the holding means 4 in step m-19 or an error in the right crossing of the straight-line areas 8a and the straight-line areas 8b existing on the surface of the wafer 2) is memorized in the central processing unit 50 (FIG. 3). When the wafer 2 is actually cut as described above, a rotation of the rotation angle to correct the inclination is added to the 90-degree rotation of the holding means 4 in order to compensate for the error.

In the embodiment described above, the binocular microscope having the two light-incoming openings 36a and 36b spaced from each other a suitable distance in the x-direction is used as the microscope 28 in the optical means 26 and the two images are projected to the second camera means 42 at the relatively high magnification. If desired, however, a monocular microscope having a single light-incoming opening can be used as the microscope in the optical means 26 to thus project a single image to the second camera means 42 at the relatively high magnification. In this case, in the aforesaid step m-7, for example, the x-direction moving source 14 of the moving means 12 may be actuated to move the holding means 4 and the wafer 2 thereon in the x-direction by a predetermined distance and thereafter it is judged whether the pattern matching means 56 detects the same pattern as the first key pattern in the image projected to the second camera means 42. In the aforesaid steps m-9 and m-11, for example, the θ-direction rough alignment and the θ-direction accurate alignment may be carried out on the basis of the y-direction positions of the same pattern as the first or second key pattern in the two images projected to the second camera means 42 before and after the holding means 4 and the wafer 2 thereon are moved in the x-direction by the predetermined distance by actuating the x-direction moving source 14 of the moving means 12.

While the present invention has been described in detail hereinabove with reference to the accompanying drawings showing preferred embodiments of the automatic accurate alignment system, it should be understood that the invention is not limited to these preferred embodiments, and various changes and modifications are possible without departing from the scope of this invention.

What is claimed is:

1. An automatic accurate alignment system for positioning an object to be worked having a certain pattern on its surface at a required position, said system comprising:
   (a) holding means for holding the object to be worked;
   (b) moving means for moving the holding means in the x-direction, the y-direction and the θ-direction;
   (c) camera means for providing an image of at least a portion of the surface of the object held on the holding means and providing analog signals indicative of the densities of x-y matrix arrayed pixels;
   (d) an image frame memory for memorizing signals corresponding to the analog signals provided by the camera means;
   (e) a key pattern memory for memorizing
      (1) a first key pattern signal based upon the signals memorized in the image frame memory, the first key pattern signal indicating a key pattern existing at one specified area in the image,
      (2) a first key pattern position signal indicative of the position of the key pattern when the object held on the holding means is positioned at a predetermined position,
      (3) a second key pattern signal indicative of the key pattern, and
      (4) a second key pattern position signal indicative of the position of the key pattern when the object to be worked is rotated in the θ-direction through 90 degrees from the predetermined position, after the second key pattern signal and the second key pattern position signal are determined from the first key pattern signal and the first key pattern position signal;

(f) pattern matching means for performing a first pattern matching based upon the signals memorized in the image frame memory and the first key pattern signal memorized in the key pattern memory, and a second pattern matching based upon the signals memorized in the image frame memory and the second key pattern signal memorized in the keypattern memory; and (g) movement control means for performing a first positioning of the object held on the holding means by actuating the moving means in response to the first pattern matching, then, rotating the holding means in the θ-direction through 90 degrees and effecting a required coordinate transformation movement in the x-direction and the y-direction, and thereafter, performing a second positioning of the object held on the holding means by actuating the moving means in response to the second pattern matching.

2. The system of claim 1 wherein the object to be worked is a semiconductor wafer having a plurality of streets arranged in a lattice pattern on its surface and the same circuit pattern applied to each of a plurality of rectangular areas defined by the streets.

3. The system of claim 2 wherein the streets and circuit pattern define a pitch, px, in the x-direction and a pitch, py, in the y direction and wherein after the 90 degrees rotation by the moving means, a pattern on the wafer, which pattern corresponds to the first key pattern at the specified area in the image, must be moved a first distance in the x-direction and a second distance in the y-direction to reposition the pattern to correspond to the position of the first key pattern in the image, the movement control means including means for calculating a remainder, αx, by dividing the first distance by the pitch py, and a reminder, αy, by dividing the second distance by the pitch, px, the movement control means further actuating the moving means to move the holding means a distance corresponding to αx in the x-direction and a distance corresponding to αy in the y-direction to effect the required coordinate transformation movement.

4. The system of claim 1 wherein optical means for projecting at least a part of the image of the surface of the object held on the holding means to the camera means at a low magnification and a relatively high magnification is provided, the memorizing of the first key pattern, the first pattern matching and the second pattern matching are performed on the basis of the image projected to the camera means at the relatively high magnification, the key pattern memory further memorizes a low magnification key pattern signal indicative of a low magnification key pattern and a low magnification key pattern position signal indicative of the position of the low magnification key pattern existing in at least one specified area in the image taken by the camera means at the relatively low magnification when the object held on the holding means is positioned at the predetermined postion, the pattern matching means further performs a low magnification patern matching on the basis of the signals memorized in the image frame memory which correspond to the image projected to the camera means at the relatively low magnification and the low magnification key pattern signal, and the movement control means further performs a preliminary positioning of the object held on the holding means by actuating the moving means on the basis of the low magnification pattern matching prior to the first positioning.

5. The system of claim 4 wherein the optical means has a first optical channel of a relatively low magnification and a second optical channel of a relatively high magnification, the camera means has a first camera means optically connected to the first optical channel and a second camera means optically connected to the second optical channel, and the camera means includes a magnification converter means for electrically connecting the first camera means and the second camera means selectively to the image frame memory.

6. The system of claim 1 wherein the camera means includes an A/D converter means for converting the analog signals outputted by the camera means into multi-value digital signals, and the image frame memory memorizes the multi-value digital signals generated by the A/D converter means.

7. The system of claim 6 wherein the first key pattern signal and the second key pattern signal memorized in the key pattern memory are multi-value digital signals corresponding to the densities of a plurality of pixels in the key pattern.

8. The system of claim 7 wherein the pattern matching means calculates the degree of matching, P, in the first pattern matching and the second pattern matching on the basis of the following equation $$P = \sum_{i,j} |[f(i,j) - \bar{f}] - [g(i,j) - \bar{g}]|$$

wherein f is a value corresponding to the density of each of a plurality of pixels in a collation area on the surface of the object held on the holding means, $\bar{f}$ is an average of f values, g is a value corresponding to the density of each of a plurality of pixels in the key pattern, and $\bar{g}$ is an average of g values.

9. The system of claim 7 wherein the pattern matching means calculates the degree of matching, P, in the first pattern matching and the second pattern matching on the basis of the following equation $$P = \sum_{i,j} |U[f(i,j) - \bar{f}] - U[g(i,j) - \bar{g}]|$$

wherein f is a value corresponding to the density of each of a plurality of pixels in a collation area on the surface of the object held on the holding means, $\bar{f}$ is an average of f values, g is a value corresponding to the density of each of a plurality of pixels in the key pattern, $\bar{g}$ is an average of g values, and U(x)=1 when x>0 and U(x)=0 when x≦0.

10. The system of claim 7 wherein the pattern matching means calculates the degree of matching, P, in the first pattern matching and the second pattern matching on the basis of the following equation $$P = \frac{\sum\limits_{i,j} [f(i,j) - \bar{f}] \times [g(i,j) - \bar{g}]}{\sqrt{\sum\limits_{i,j} [f(i,j) - \bar{f}]^2 \times \sum\limits_{i,j} [g(i,j) - \bar{g}]^2}}$$

wherein f is a value corresponding to the density of each of a plurality of pixels in a collation area on the surface of the object held on the holding means, $\bar{f}$ is an average of f values, g is a value corresponding to the density of each of a plurality of pixels in the key pattern, and $\bar{g}$ is an average of g values.

11. The system of claim 1 wherein the camera means is composed of a solid-state camera having a plurality of image sensor elements arrayed in an x-y matrix.

* * * * *